(12) United States Patent
Komaki et al.

(10) Patent No.: US 11,537,056 B2
(45) Date of Patent: Dec. 27, 2022

(54) MEASUREMENT APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Takamitsu Komaki, Utsunomiya (JP); Tadao Nakamura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/906,299

(22) Filed: Jun. 19, 2020

(65) Prior Publication Data

US 2020/0409277 A1 Dec. 31, 2020

(30) Foreign Application Priority Data

Jun. 25, 2019 (JP) .............................. JP2019-117715

(51) Int. Cl.
G03F 9/00 (2006.01)

(52) U.S. Cl.
CPC .......... G03F 9/7069 (2013.01); G03F 9/7065 (2013.01)

(58) Field of Classification Search
CPC ............................. G03F 9/7065; G03F 9/7069
See application file for complete search history.

(56) References Cited

U.S. PATENT DOCUMENTS

| | | | | |
|---|---|---|---|---|
| 8,576,378 B2 * | 11/2013 | Mori | ................... | G03F 7/70091 355/71 |
| 8,922,786 B2 | 12/2014 | Iwai | | |
| 2007/0263192 A1 * | 11/2007 | Bubke | ................ | G02B 27/0927 355/53 |
| 2015/0234290 A1 * | 8/2015 | Mathijssen | ............ | G01B 11/14 355/67 |
| 2017/0329217 A1 * | 11/2017 | Minoda | ................. | G03F 7/0002 |
| 2018/0259863 A1 * | 9/2018 | Komaki | ................ | G03F 7/0002 |
| 2019/0250525 A1 * | 8/2019 | Komaki | ................ | G03F 9/7042 |
| 2020/0249589 A1 * | 8/2020 | Maeda | .................. | G03F 9/7046 |

FOREIGN PATENT DOCUMENTS

JP          2013102139 A          5/2013

\* cited by examiner

*Primary Examiner* — Deoram Persaud
(74) *Attorney, Agent, or Firm* — Rossi, Kimms & McDowell LLP

(57) ABSTRACT

The present invention provides a measurement apparatus that measures a position of an object which includes a first mark and a second mark, comprising: an image capturing unit configured to capture the first mark and the second mark in a state in which the first mark and the second mark are contained in a field of view; and a polarizing element configured to generate different polarization directions from each other in light from the first mark and in light from the second mark which are incident on the image capturing unit.

19 Claims, 12 Drawing Sheets

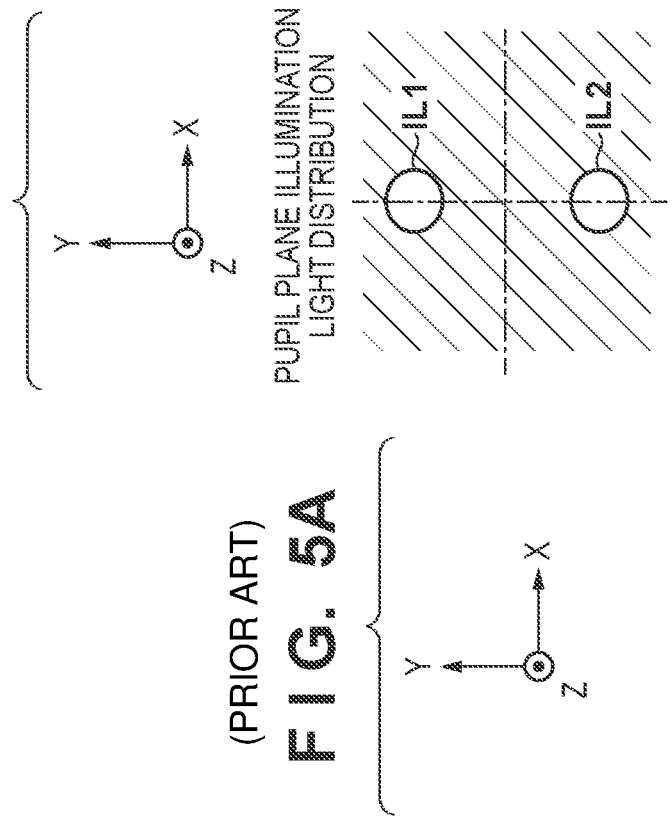
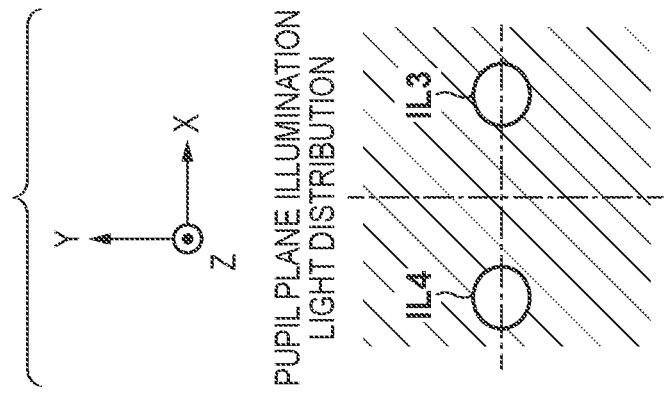
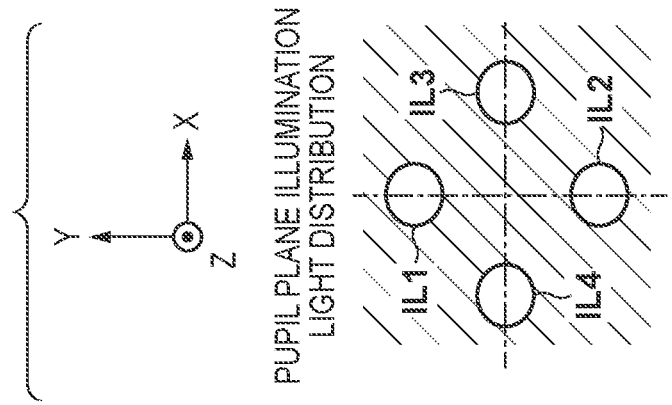
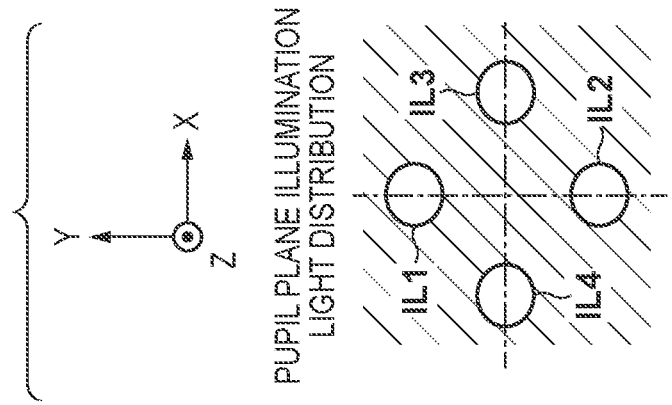

F I G. 6
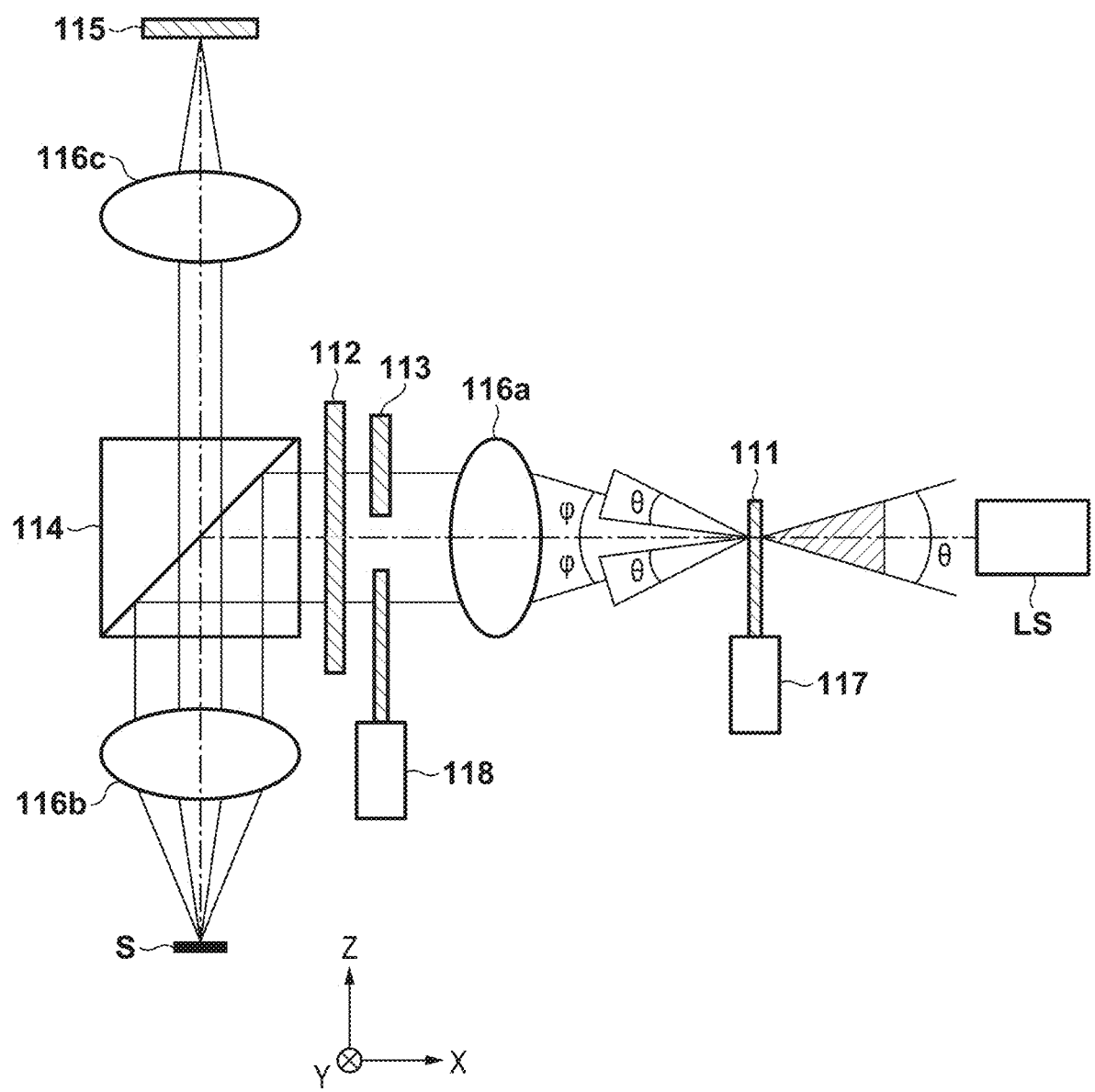

FIG. 7
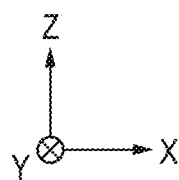
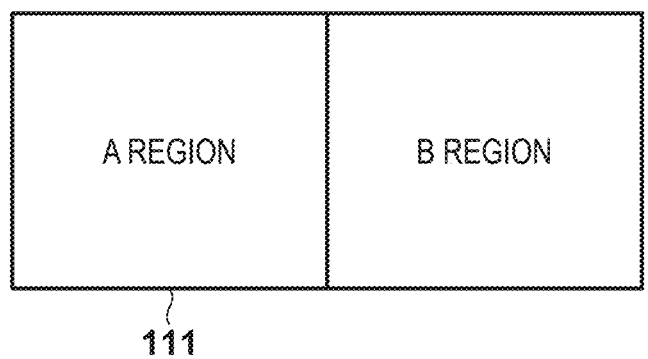
FIG. 8A
A REGION
DEFLECTION ANGLE
FIG. 8B
B REGION
DEFLECTION ANGLE
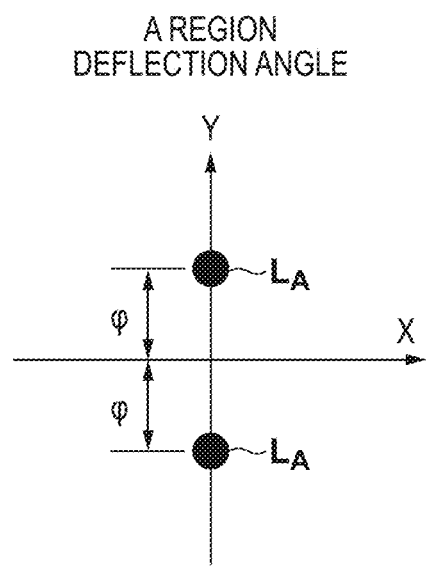
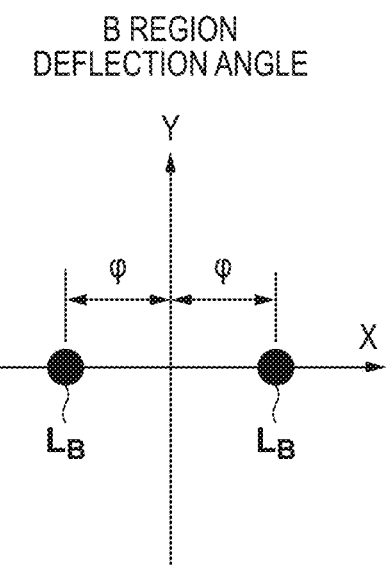
FIG. 9A
PUPIL PLANE LIGHT DISTRIBUTION
(FIRST LIGHT)
FIG. 9B
PUPIL PLANE LIGHT DISTRIBUTION
(SECOND LIGHT)
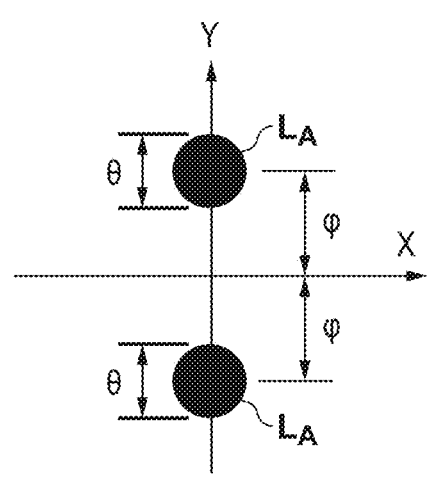
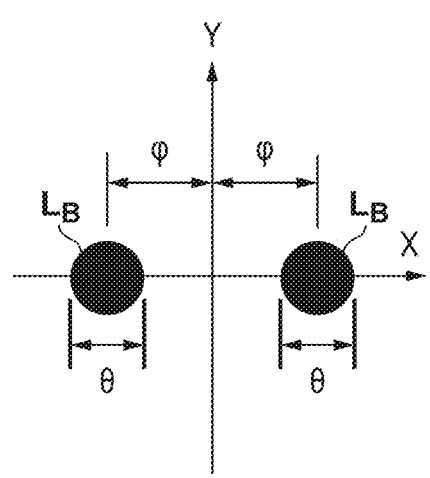

FIG. 14
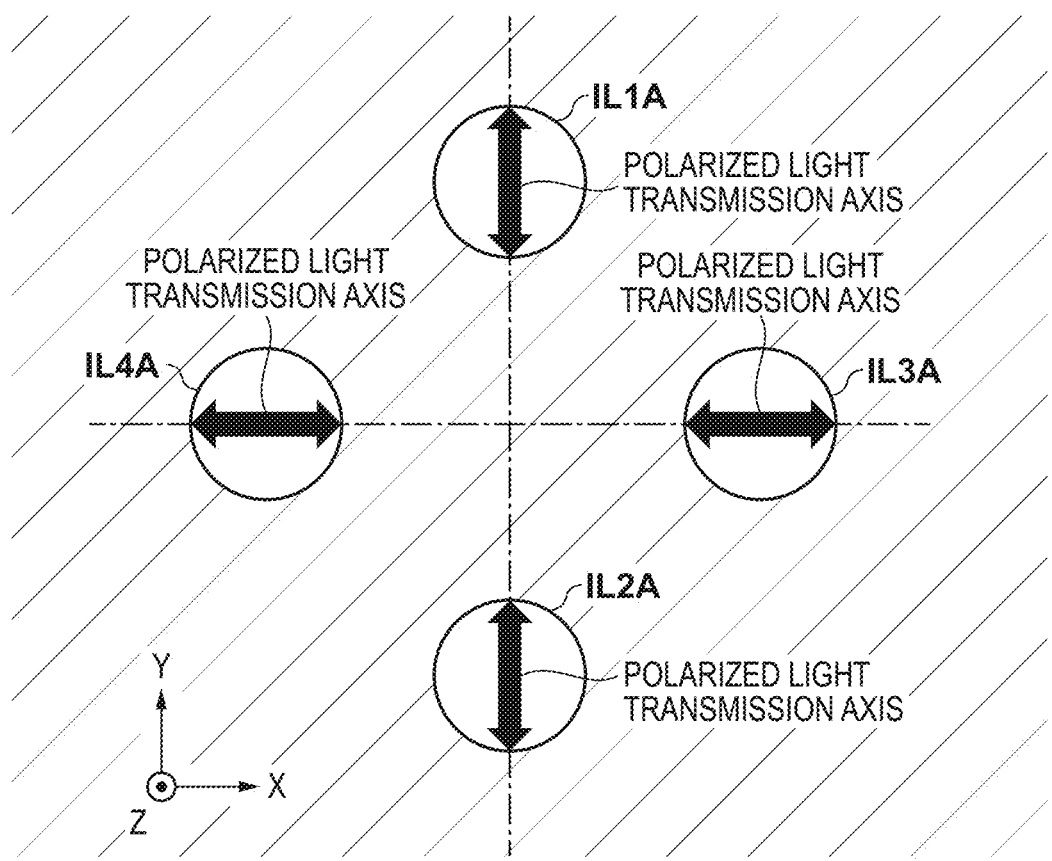
FIG. 15
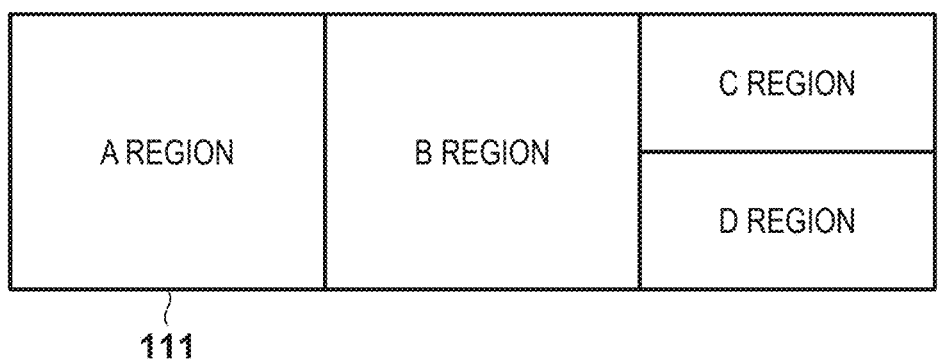
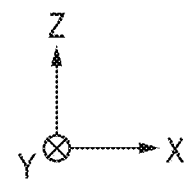

MEASUREMENT APPARATUS, LITHOGRAPHY APPARATUS, AND METHOD OF MANUFACTURING ARTICLE

BACKGROUND OF THE INVENTION

Field of the Invention

The present invention relates to a measurement apparatus that measure a position of an object, a lithography apparatus, and a method of manufacturing an article.

Description of the Related Art

An imprint apparatus that forms an imprint material pattern on a substrate by using a mold is gaining attention as a lithography apparatus for mass-producing semiconductor devices, magnetic storage devices, and the like. An imprint apparatus can form an imprint material pattern on a substrate by curing the imprint material in a state in which the imprint material on the substrate and a mold are in contact with each other, and separating the mold from the cured imprint material.

In an imprint apparatus, a die-by-die method is used as a method for positioning a mold and a shot region of a substrate. The die-by-die method is a method that measures, for each shot region, relative positions of a mark formed on the shot region of the substrate and a mark formed on the mold, and corrects the relative positions and the shape difference between the shot region and the mold based on this measurement result.

Japanese Patent Laid-Open No. 2013-102139 discloses an imprint apparatus that includes a detector which detects marks for positioning formed on a mold and marks for positioning formed on a substrate and measures the relative positions of the mold and the substrate in the X direction and the Y direction. The detector disclosed in Japanese Patent Laid-Open No. 2013-102139 is formed to illuminate both an X mark for measuring an X-direction position and a Y mark for measuring a Y-direction position and capture the light beams from both marks by a single image capturing element.

Unnecessary light that has been scattered by an edge of a mark for positioning is sometimes generated in the detector disclosed in Japanese Patent Laid-Open No. 2013-102139. Since such unnecessary light that is incident on the image capturing element will become noise for the detection light from the mark, a measurement error will occur at the mark position, and it can become difficult to accurately measure the relative positions of the substrate and the mold as objects.

SUMMARY OF THE INVENTION

The present invention provides, for example, a technique advantageous in accurately measuring a position of an object.

According to one aspect of the present invention, there is provided a measurement apparatus that measures a position of an object which includes a first mark and a second mark, comprising: an image capturing unit configured to capture the first mark and the second mark in a state in which the first mark and the second mark are contained in a field of view; and a polarizing element configured to generate different polarization directions from each other in light from the first mark and in light from the second mark which are incident on the image capturing unit.

Further features of the present invention will become apparent from the following description of exemplary embodiments with reference to the attached drawings.

BRIEF DESCRIPTION OF THE DRAWINGS

FIGS. 5A to 5D are views for explaining the problematic point regarding the conventional alignment scope;

FIG. 6 is a schematic view showing an example of an alignment scope according to the first embodiment;

FIG. 7 is a schematic view showing an example of the arrangement of an optical element according to the first embodiment;

FIGS. 8A and 8B are views showing light polarized by the optical element according to the first embodiment;

FIGS. 9A and 9B are views showing an angle distribution of light generated by the optical element according to the first embodiment;

FIG. 14 is a view showing an example of another arrangement of the aperture stop and the polarizing element;

FIG. 15 is a view showing an example of another arrangement of the optical element.

DESCRIPTION OF THE EMBODIMENTS

Figure 1:
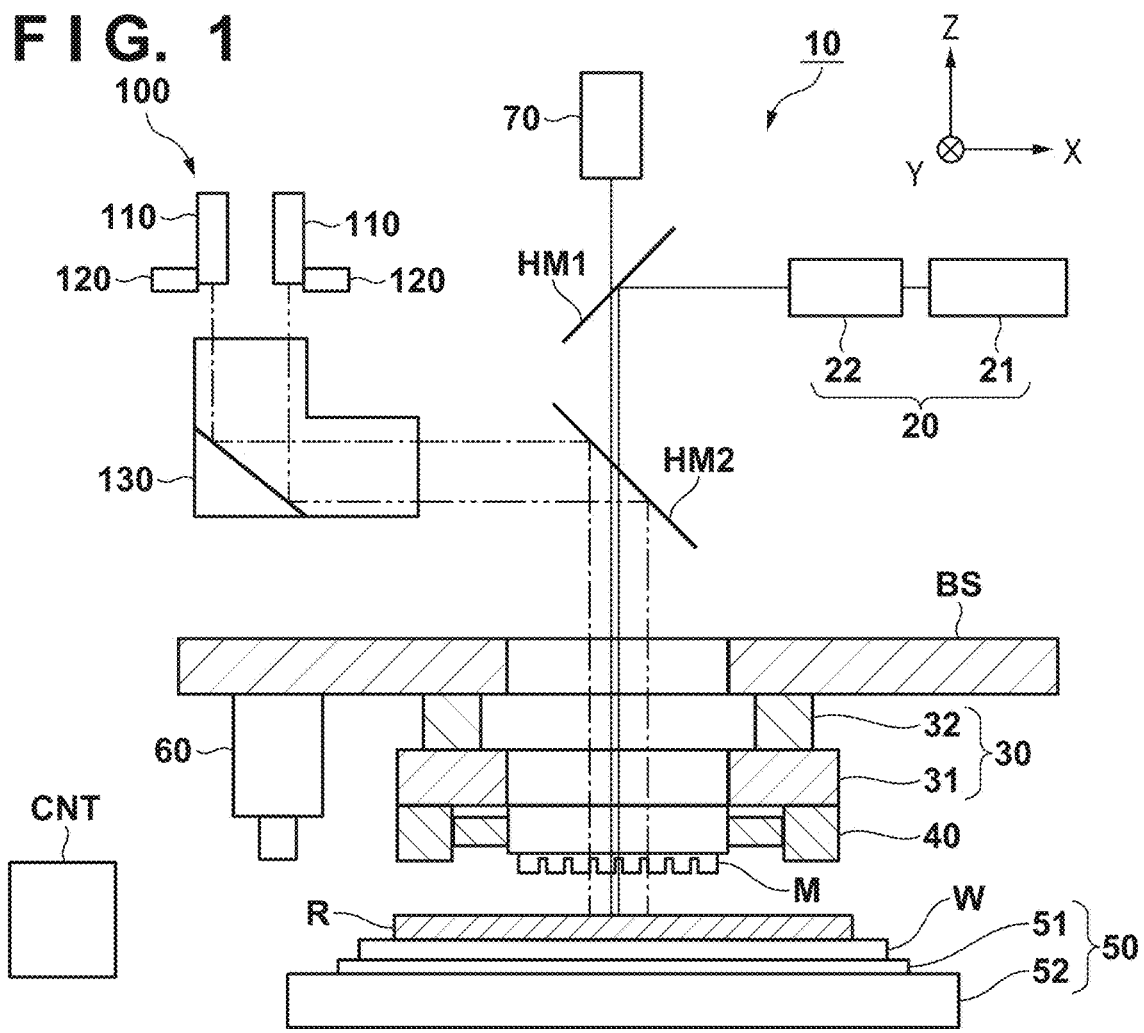
FIG. 1 is a schematic view showing an example of the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Although an imprint apparatus that forms an imprint material pattern on a substrate by using a mold will be exemplified as a lithography apparatus in the following embodiments, the present invention is not limited to this. The present invention is also applicable to other lithography apparatuses, for example, a planarization apparatus that planarizes a composition on a substrate by using a member, an exposure apparatus that exposes a substrate and transfers the pattern of an original onto the substrate, a lithography apparatus that uses a charged particle beam to form a pattern on a substrate, and the like.

First Embodiment

An imprint apparatus is an apparatus that brings a mold and an imprint material supplied onto a substrate into contact with each other and applies curing energy to the imprint material to form a cured object pattern on which a pattern with convex and concave portions of the mold has been transferred. For example, an imprint apparatus will supply an imprint material onto a substrate and cure the imprint material in a state in which a mold having a pattern with convex and concave portions is in contact with the imprint material on the substrate. The pattern of the mold can be transferred to the imprint material on the substrate by separating (releasing) the mold from the cured imprint material by increasing the interval between the mold and the substrate. This series of processes is called an "imprint process" and performed on each of a plurality of shot regions on the substrate.

As an imprint material, a curable composition (to be also referred to a resin in an uncured-state) that is cured by receiving curing energy is used. Examples of the curing energy are an electromagnetic wave, heat, and the like. The electromagnetic wave is light selected from the wavelength range of 10 nm (inclusive) to 1 mm (inclusive), for example, infrared light, a visible light beam, ultraviolet light, or the like.

The curable composition can be a composition cured with light irradiation or heating. Among these compositions, a photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material can be supplied on the substrate in the form of a film by a spin coater or a slit coater. Alternatively, the imprint material may be applied on the substrate in the form of droplets or in the form of an island or film obtained by connecting a plurality of droplets supplied by a liquid injection head. The viscosity (the viscosity at 25° C.) of the imprint material is, for example, 1 mPa·s (inclusive) to 100 mPa·s (inclusive).

[Arrangement of Imprint Apparatus]

FIG. 1 is a schematic view showing an example of the arrangement of an imprint apparatus 10. The imprint apparatus 10 can include, for example, a curing unit 20, a mold holding unit 30, a mold correction unit 40, a substrate holding unit 50, a supplying unit 60, an observation unit 70, a measurement unit 100 (measurement apparatus), and a control unit CNT. The control unit CNT is formed by, for example, a computer which includes a CPU, a memory, and the like, and the control unit CNT controls each unit of the imprint apparatus 10 (controls the imprint process). In addition, the imprint apparatus 10 includes a bridge plate BS for supporting the mold holding unit 30 and a base plate (not shown) for movably supporting the substrate holding unit 50. In FIG. 1, two directions, which are different from each other (for example, two directions which are perpendicular to each other) on a plane parallel to the surface of a substrate W, are set as the X direction and the Y direction, respectively, and a direction perpendicular to the X direction and the Y direction is set as the Z direction.

A mold M is, for example, a mold on which a pattern with convex and concave portions, such as a circuit pattern of a device or the like, has been three-dimensionally formed. The mold M is manufactured by using a material such as quartz which is capable of transmitting ultraviolet light. In addition, glass, a ceramic, a metal, a semiconductor, a resin, or the like can be used as the substrate W. A member made of a material different from the substrate may be formed as needed on the surface of the substrate W. More specific examples of the substrate W are a silicon wafer, a compound semiconductor wafer, silica glass, and the like. In addition, an adhesive layer for improving the adhesion of the imprint material to the substrate can be arranged as needed before the imprint material is to be supplied.

The curing unit 20 cures an imprint material R (a resin, a resist, or the like) by irradiating the imprint material R on the substrate with light (for example, ultraviolet light) via the mold M. In this embodiment, the imprint material R is an ultraviolet curing resin having a property of being cured by ultraviolet irradiation. The curing unit 20 includes, for example, a light source unit 21 and an optical system 22. The light source unit 21 can include, for example, a light source such as a mercury lamp that emits curing light (for example, infrared light, gamma rays, or the like) for curing the imprint material R and an elliptical mirror that condenses the curing light emitted from the light source. The optical system 22 can include a lens, an aperture, and the like for forming the curing light so that the imprint material R on the shot region will be irradiated with the curing light emitted from the light source unit 21. The aperture can be used to control the angle of view for irradiating a shot region (target shot region) to be the target of the imprint process with the curing light, be used to execute peripheral light shielding control to restrict the curing light from irradiating a region outside the shot region of the substrate W, and the like. The optical system 22 can include an optical integrator to uniformly illuminate the mold M. Light emitted from the optical system 22 is reflected by a half mirror HM1 and is incident on the imprint material R on the substrate via a half mirror HM2 and the mold M.

The mold holding unit 30 is also referred to as an imprint head, and can include, for example, a mold chuck 31 that holds the mold M and a mold driving unit 32 that drives the mold M by driving the mold chuck 31. The mold holding unit 30 includes a positioning mechanism which controls the position of the mold M with respect to six axes and a mechanism to press the mold M against the substrate W or the imprint material R on the substrate W and to separate the mold M from the cured imprint material R. In this case, the six axes can include, in addition to the X-axis, the Y-axis, and the Z-axis, respective rotations about these axes.

The mold correction unit 40 is arranged on, for example, the mold holding unit 30, and corrects the shape of the mold M by using an actuator such as a cylinder or the like that operates by air, a fluid such as oil, or the like to apply pressure to the mold M in the peripheral direction. In addition, the mold correction unit 40 may include, for example, a temperature control mechanism to control the temperature of the mold M, and may be formed to correct the shape of the mold M by controlling the temperature of the mold M. The shape of the substrate W can become deformed (typically, expansion or reduction) after undergoing a process such as annealing or the like. The mold correction unit 40 can correct the shape of the mold M, in accordance with such deformation of the substrate W, so that an overlay error difference between the pattern of the mold M and the pattern (the shot region) on the substrate will fall within a permitted range.

The substrate holding unit 50 is also referred to as a substrate stage, and can be formed to be able to move while holding the substrate W. The substrate holding unit 50 can include, for example, a substrate chuck 51 that chucks the substrate W and a substrate driving unit 52 that drives the substrate W by driving the substrate chuck 51. The substrate driving unit 52 can include a positioning mechanism to control the position of the substrate W by controlling the position of the substrate W with respect to the six axes described above.

The supplying unit 60 supplies (applies) the imprint material R onto the substrate. The supplying unit 60 can include, for example, a tank that stores the imprint material R, a plurality of discharge outlets that discharge, to the substrate W, the imprint material R supplied from the tank through a supply path, a piezoelectric element arranged on the supply path communicated with each discharge outlet, and a supply amount control unit. The supply amount control unit can, for example, adjust the signal value to be supplied to the piezoelectric element to control the amount of the imprint material R which is to be discharged as a droplet from one discharge outlet.

The observation unit 70 can include a scope for observing a target shot region of the substrate W which is undergoing the imprint process. For example, the observation unit 70 includes an image capturing element that has a field of view containing the entire target shot region, and captures the target shot region that is undergoing the imprint process by the image capturing element. The observation unit 70 is used to confirm the imprinting state of the mold M and the imprint material R, the progress of the operation performed to fill the concave portions of the pattern of the mold M with the imprint material R, and the like.

The measurement unit 100 (measurement apparatus) can include, for example, alignment scopes 110, driving mechanisms 120, and an optical system 130. The alignment scopes 110 detect alignment marks (to be sometimes referred to as mold marks hereinafter) provided on the mold M and alignment marks (to be sometimes referred to as substrate marks hereinafter) provided on the substrate W. Although a more specific arrangement will be described later, the alignment scopes 110 can measure the relative position of these marks (that is, the relative position between the mold M and the substrate W) based on an image obtained by capturing the mold marks and the substrate marks by the image capturing sensor. The plurality of alignment scopes 110 can be arranged so as to be in correspondence with the number of mark pairs formed by the mold marks and the substrate marks. Also, for example, the driving mechanism 120 is arranged for each alignment scope 110, and drives the corresponding alignment scope in the X and Y directions in accordance with the position of a mark pair to be detected. The optical system 130 can include a lens, an aperture, a mirror, a half mirror, and the like for adjusting the optical patch of the alignment scopes 110.

[Imprint Process]

An imprint process performed by the above-described imprint apparatus 10 will be described. The control unit CNT can control the imprint process. First, a mold conveyance unit (not shown) conveys the mold M to the mold holding unit 30, and the mold M is held by the mold holding unit 30 (the mold chuck 31) by vacuum chuck or the like. A substrate conveyance unit (not shown) conveys the substrate W to the substrate holding unit 50, and the substrate W is held by the substrate holding unit 50 (the substrate chuck 51) by vacuum chuck or the like. Next, a shot region (target shot region) which is to undergo the imprint process is moved below the supplying unit 60, and the supplying unit 60 supplies the imprint material R (for example, a droplet) onto the target shot region (supplying step).

After the imprint material has been supplied onto the target shot region, the target shot region is moved below the mold M, and the mold M is brought into contact with the imprint material R on the substrate by relatively driving the mold M and the substrate W in the Z direction so that the interval between the mold M and the substrate W will decrease (contacting step). In the contacting step, the imprint material R gradually spreads between the mold M and the substrate W and fills the concave portions of the pattern formed on the mold M. In addition, in the contacting step, positioning (alignment) of the mold M and the substrate W is performed based on the measurement result by the measurement unit 100. The positioning operation can include an operation to correct the relative position (X and Y directions) of the mold M and the substrate W performed by the mold driving unit 32 and the substrate driving unit 52 and an operation to correct the shape of the mold M performed by the mold correction unit 40.

After the imprint material R has filled the concave portions of the pattern of the mold M and the positioning of the mold M and the substrate W has been completed, the curing unit 20 irradiates the imprint material R with light to cure the imprint material R (curing step). The mold M is separated from the cured imprint material R by relatively driving the mold M and the substrate W in the Z direction to increase the interval between the mold M and the substrate W (separating step). As a result, a pattern layer of the imprint material R on which the pattern with convex and concave portions of the mold M has been transferred can be formed on the target shot region. This kind of imprint process is performed on each of the plurality of shot regions on the substrate W.

[Arrangement of Alignment Marks]

Figure 2:
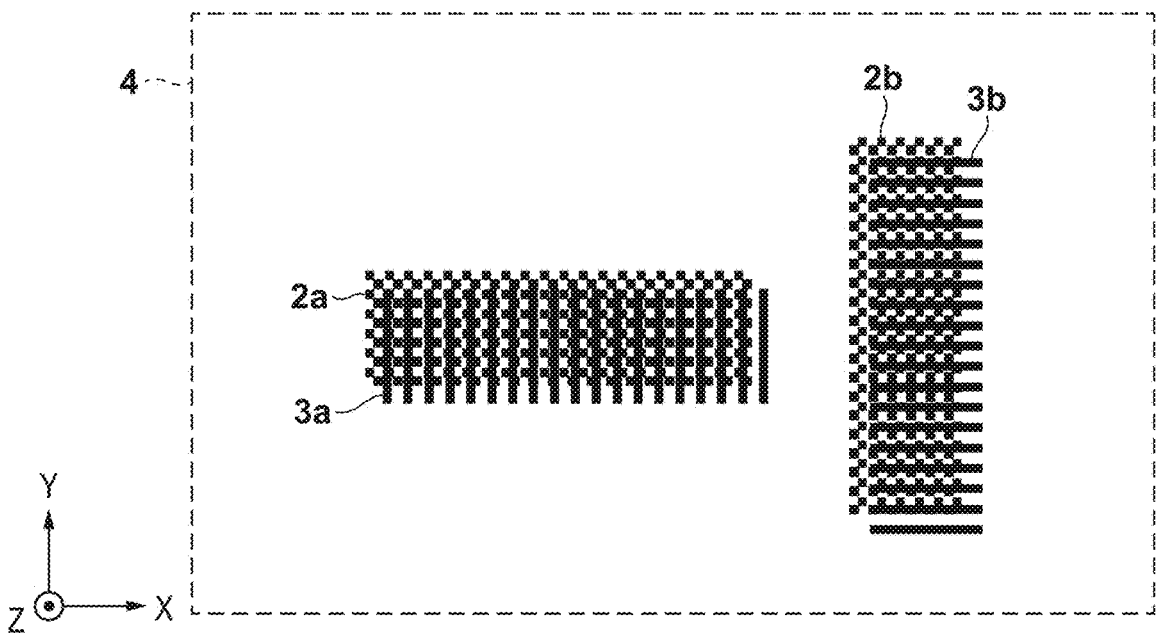
FIG. 2 is a view showing an example of the arrangement of alignment marks.
Figure 3:
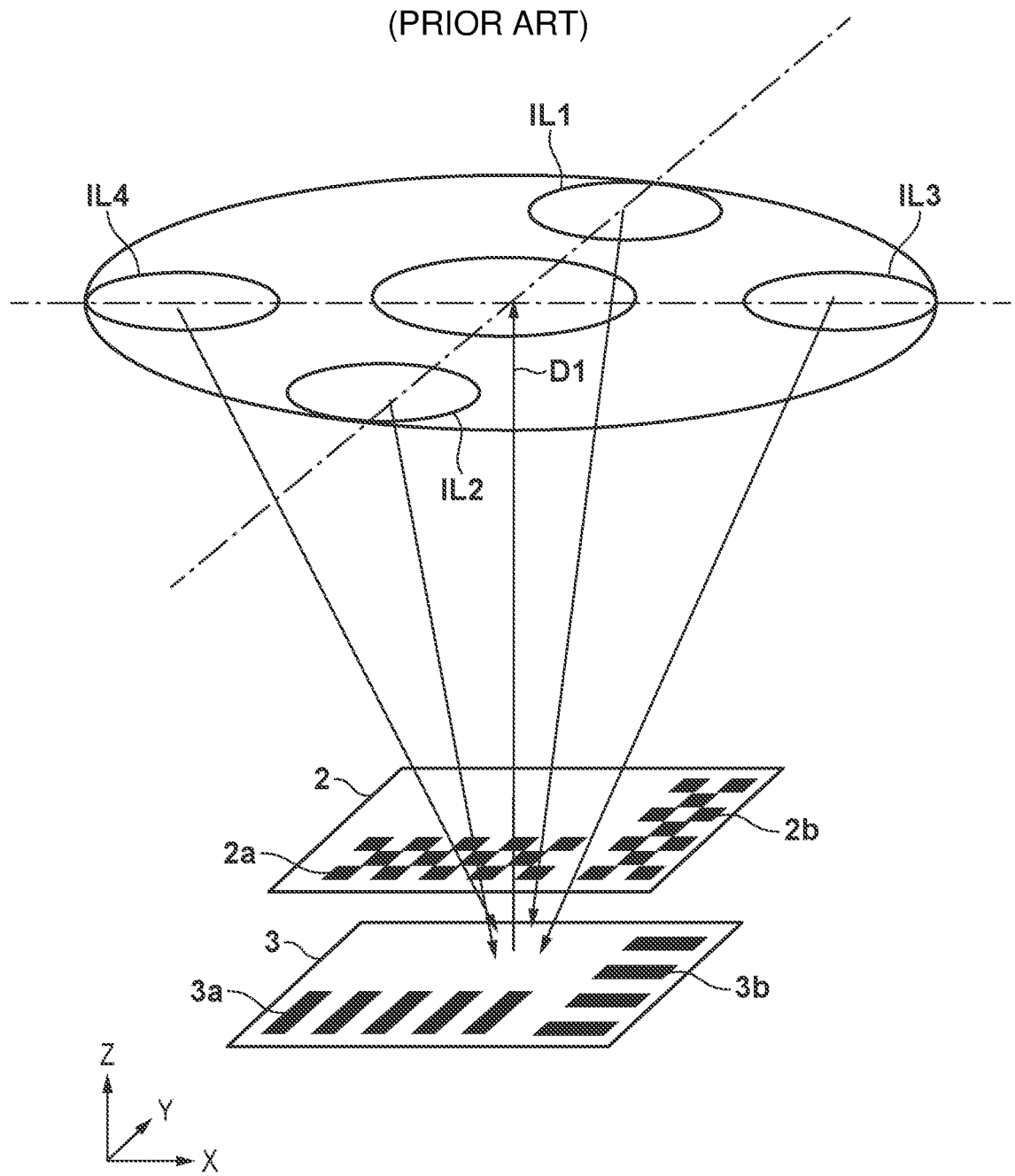
FIG. 3 is a view for explaining mark illumination by a conventional alignment scope.

An example of the arrangement of alignment marks (mold marks 2 and substrate marks 3) will be described next. FIG. 2 is a view showing an example of the alignment marks captured by each alignment scope 110. The alignment marks are arranged on the objects (the mold M and the substrate W) so as to fall within the image capturing field of view of the alignment scope 110 (the image capturing unit 115). FIG. 2 shows a state in which the mold marks 2 and the substrate marks 3 have been overlaid in an image capturing field of view 4 of the alignment scope 110.

The mold marks 2 can include a mark (a mold mark 2a for X measurement) for measuring a position in the X direction and a mark (a mold mark 2b for Y measurement) for measuring a position in the Y direction. In the example shown in FIG. 2, the mold mark 2a for X measurement and the mold mark 2b for Y measurement include a grating pitch P1 in the X direction and a grating pitch P2 in the Y direction, respectively. Each mold mark has a checkerboard grating pattern.

On the other hand, the substrate marks 3 also include, in correspondence with the mold marks 2, a mark (a substrate mark 3a for X measurement) for measuring a position in the X direction and a mark (a substrate mark 3b for Y measurement) for measuring a position in the Y direction. In the example shown in FIG. 2, the substrate mark 3a for X measurement includes a grating pattern that has a grating pitch P3 which is different from the grating pitch P1 of the mold mark 2a for X measurement. Also, the substrate mark 3b for Y measurement includes a grating pattern that has a grating pitch P4 which is different from the grating pitch P2 of the mold mark 2b for Y measurement.

When the mold marks 2 and the substrate marks 3 that have been formed in this manner are overlaid, the diffracted light beams from these marks (grating patterns) will interfere and generate a moiré fringe (interference fringe). Each alignment scope 110 can capture a moiré fringe generated in this manner, and measure the relative positions of the mold marks 2 and the substrate marks 3 (the relative positions of the mold M and the substrate W) from the captured image.

[Problematic Point of Conventional Alignment Scope]

Figure 4A:
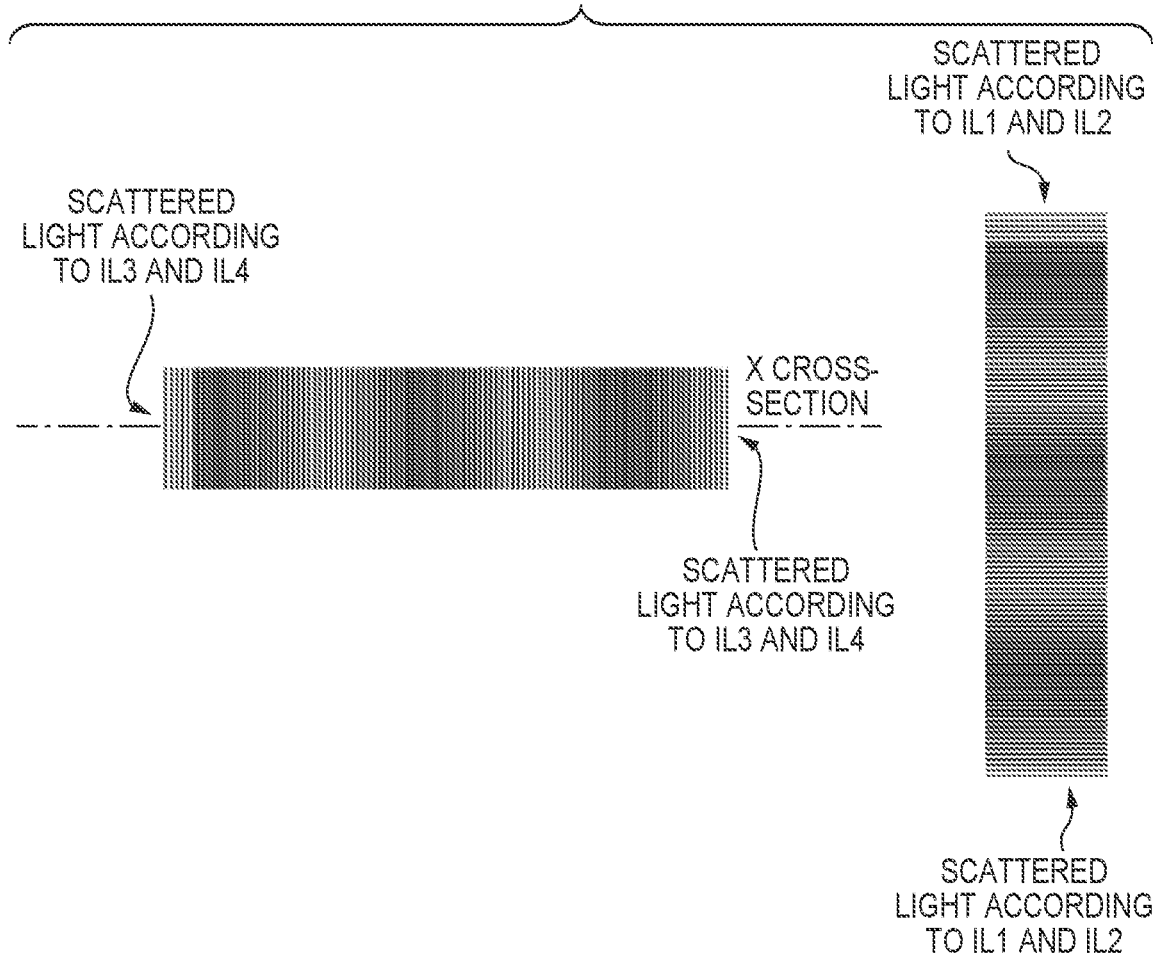
FIGS. 4A and 4B are views for explaining a problematic point regarding the conventional alignment scope.

A problematic point regarding a case in which the above-described alignment marks (the mold marks 2 and the substrate marks 3) are detected by a conventional alignment scope will be described next with reference to FIGS. 3 to 5D. In a conventional alignment scope, the mold marks 2 (2a and 2b) and the substrate marks 3 (3a and 3b) are illuminated by illumination light distributions IL1 to Il4 (that is all of the illumination light beams IL1 to IL4) on the pupil plane of an illumination optical system. The mold marks 2 and the substrate marks 3 are simultaneously captured by an image capturing element via a detection aperture D1 on the pupil plane of the illumination optical system. That is, light beams diffracted by the mold marks 2 and the substrate marks 3, respectively, are detected by the image capturing element as a moiré fringe signal, as shown in FIG. 4A, via the detection aperture D1 on the pupil plane of the illumination optical system.

Figure 4B:
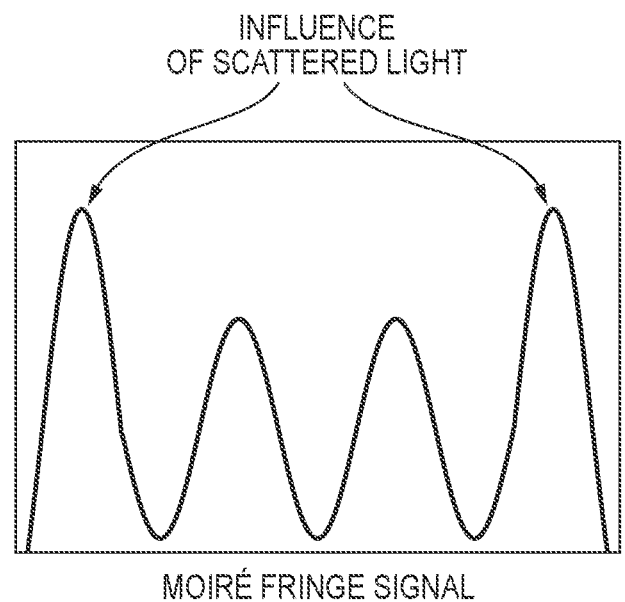

In this case, a moiré fringe signal of the mold mark 2a and the substrate mark 3a for X measurement is generated by illumination by the illumination light beams IL1 and IL2, and the illumination light beams IL3 and IL4 are not used to generate the moiré fringe signal. Hence, if the mold mark 2a and the substrate mark 3a for X measurement are illuminated by the illumination light beams IL3 and IL4, the illumination light beams IL3 and IL4 will scatter at the edges of these marks, and the scattered light beams will mix into the moiré fringe signal as a flare. For example, FIG. 4B shows a signal intensity distribution (a light intensity distribution on the light receiving surface of the image capturing element) in the X direction of the moiré fringe signal (for X measurement) shown in FIG. 4A. As shown in FIG. 4B, if the mold mark 2a and the substrate mark 3a for X measurement are illuminated by the illumination light beams IL3 and IL4, the intensity of the peak signal at the edge of the signal intensity distribution will become higher than that at the center portion due to the influence of the scattered light beams from the edges of these marks. In the example shown in FIG. 4B, the peak signal at two periods at the two ends of the peak signal of the four periods which are present can receive the influence of the scattered light beams, and the measurement accuracy of the mark positions can be degraded. Although a case in which the moiré fringe signal has a peak signal for four periods has been described here, the periods of the peak signal can be arbitrary.

In a similar manner, a moiré fringe signal is generated when the mold mark 2b and the substrate mark 3b for Y measurement are illuminated by the illumination light beams IL3 and IL4, and the illumination light beams IL1 and IL2 are not used to generate the moiré fringe signal. Hence, if the mold mark 2b and the substrate mark 3b for Y measurement are illuminated by the illumination light beams IL1 and IL2, the illumination light beams IL1 and IL2 will scatter at the edges of these marks, and the scattered light beams will mix into the moiré fringe signal as a flare. As a result, it can degrade the measurement accuracy of the mark positions.

Also, in general, even in a case in which a mark in which a moiré fringe signal is not generated is to be detected, a light beam that is not used in the measurement of the mark position can become a scattered light beam in a similar manner and influence the measurement accuracy of the mark position. This phenomenon will be described with reference to FIGS. 5A to 5D. FIG. 5A is a view showing an example of the arrangement of a mark (an X-measurement mark) for measuring a position in the X direction and a mark (a Y-measurement mark) for measuring a position in the Y direction. Also, each of FIGS. 5B to 5D is a view showing a detection image obtained by the image capturing element when the marks are illuminated by predetermined illumination light distributions. A black thick line indicates the reflected light from each mark in each detection image shown in FIGS. 5B to 5D.

FIG. 5B shows a detection image obtained by the image capturing element when each mark is illuminated by the illumination light beams IL1 and IL2 (Y-direction angle distributions). In this case, since the image capturing element will detect the light reflected by an edge in the Y direction of each mark, a corresponding position in the Y direction can be measured by using each Y-measurement mark. Also, FIG. 5C shows a detection image obtained by the image capturing element when each mark is illuminated by the illumination light beams IL3 and IL4 (X-direction angle distributions). In this case, since the image capturing element will detect the light reflected by an edge in the X direction of each mark, a corresponding position in the X direction can be measured by using each X-measurement mark. On the other hand, FIG. 5D shows a detection image obtained by the image capturing element when each mark is illuminated by all of the illumination light beams IL1 to IL4 in the manner of the conventional alignment scope. In this case, each illumination light beam is scattered by the edge of each mark in the non-measurement direction, and the scattered light beams unnecessary for the measurement of the mark positions are generated as noise components in the detection image. As a result, it can degrade the detection accuracy of the mark positions.

[Arrangement of Alignment Scope According to Embodiment]

The alignment scope 110 according to this embodiment will be described next. FIG. 6 is a schematic view showing an example of the arrangement of the alignment scope 110 according to this embodiment. The alignment scope 110 according to this embodiment includes, for example, an illumination optical system that uses light from a light source LS to illuminate marks arranged on a detection surface S (object) and a detection optical system that detects light from the marks.

An example in which marks (the mold marks 2 and the substrate marks 3) that generate moiré fringe signals are used as the marks arranged on the detection surface S will be described hereinafter unless otherwise mentioned. Also, the X direction and the Y direction to be used in the description hereinafter are defined as directions perpendicular to the optical axis and have been converted into directions on the detection surface S by using the directions on the detection surface S as a reference. That is, the X direction and the Y direction defined on the detection surface S are defined as the X direction and the Y direction, respectively, on an optical element 111, aperture stop 112, and a polarizing element 113 which are to be described later. As an example, X-polarized light and Y-polarized light on the detection surface S will be defined as X-polarized light and Y-polarized light on the polarizing element 113.

The illumination optical system includes, for example, the optical element 111, the aperture stop 112, the polarizing element 113, a prism 114 (a beam splitter), and a plurality of lenses 116a and 116b. The aperture stop 112 and the polarizing element 113 can be arranged on the pupil plane of the illumination optical system. Also, the detection optical system includes the prism 114, an image capturing unit 115 including light receiving surface, and the plurality of lenses 116b and 116c that form an image of the light from each mark on the light receiving surface of the image capturing unit 115, and shares the prism 114 and the lens 116b with the illumination optical system. The image capturing unit 115 includes, for example, a two-dimensional image sensor (image capturing element) such as a CCD image sensor, a CMOS image sensor, or the like, and has the image capturing field of view 4 in which the X-measurement marks (the mold mark 2a and the substrate mark 3a) and the Y-measurement marks (the mold mark 2b and the substrate mark 3b) can be contained.

In the alignment scope 110 according to this embodiment, light from each mark arranged on the detection surface is transmitted through a transmission portion (near the optical axis) of the prism 114 and is incident on the image capturing unit 115. In addition, the X-measurement marks (the mold mark 2a and the substrate mark 3a) and the Y-measurement marks (the mold mark 2b and the substrate mark 3b) can be contained in the same field of view of the image capturing unit 115. That is, the light beams from the X-measurement marks and the light beams from the Y-measurement marks will pass through the prism 114 and the lens 116b and 116c and be incident on the same image capturing unit 115.

The optical element 111 polarizes the light from the light source LS and generates light that has a desired angle distribution. The optical element 111 can be arranged on an optical path of one illumination optical system which illuminates the detection surface S (imaging plane) with the light from the light source LS. The optical element 111 is also connected to a driving unit 117 (actuator) as shown in FIG. 6, and can be formed to be able to switch (change) the angle distribution to be generated. Although at least one of, for example, a diffraction optical element, a microlens array, a spatial light modulator, and the like is applicable as the optical element 111, an example in which a diffraction optical element is used will be described hereinafter. A DMD (Digital Mirror Array, Digital Micromirror Device) can be used as the spatial light modulator.

The optical element 111 according to this embodiment includes, as shown in FIG. 7, an A region (first region) and a B region (second region) that diffract light from the light source LS at different angles from each other. As shown in FIG. 8A, the A region generates first light LA by diffracting, at a diffraction angle φ in the Y direction, the light that is vertically incident from the light source LS onto the A region. As shown in FIG. 8B, the B region generates second light LB by diffracting, at the diffraction angle φ in the X direction, the light that is vertically incident from the light source LS onto the B region. Although the optical element 111 may have an arrangement in which the A region and the B region are provided on a single glass plate (one optical member), it may be arranged so that a glass plate on which the A region is formed and a glass plate on which B region are formed are arranged next to each other.

In addition, a light beam that is incident on the A region of the optical element 111 at a maximum angle θ/2 of incidence will form an angle distribution (a distribution of the first light LA shown in FIG. 9A), which is obtained by the convolution of an angle θ and the diffraction angle φ in the Y direction, on a position (for example the position of the polarizing element 113) of the pupil plane of the illumination optical system. The first light LA which has such an angle distribution (first angle distribution) illuminates each mark (first mark) of a first portion corresponding to (conjugate to) the A region of the detection surface S. In a similar manner, a light beam that is incident on the B region of the optical element 111 at the maximum angle θ/2 of incidence will form an angle distribution (a distribution of the second light LB shown in FIG. 9B), which is obtained by the convolution of the angle θ and the diffraction angle φ in the X direction, on a position of the pupil plane of the illumination optical system. The second light LB which has such an angle distribution (second angle distribution) illuminates each mark (second mark) of a second portion corresponding to (conjugate to) the B region of the detection surface S.

For example, in a case in which the moiré fringe signal is to be generated, the X-measurement marks (the mold mark 2a and the substrate mark 3a) can be applied as the first marks to be arranged on the first portion of the detection surface S. In a case in which the moiré fringe signal is not to be generated, the Y-measurement marks can be applied as the first marks. On the other hand, for example, in a case in which the moiré fringe signal is to be generated, the Y-measurement marks (the mold mark 2b and the substrate mark 3b) can be applied as the second marks to be arranged on the second portion of the detection surface S. In a case in which the moiré fringe signal is not to be generated, the X-measurement marks can be applied as the second marks.

The aperture stop 112 is arranged at a position that has a Fourier transform relationship with respect to the optical element 111, and blocks unnecessary light and 0th-order light from the optical element 111. The aperture stop 112 includes an aperture portion that transmits light of a portion to be used to illuminate each mark arranged on the detection surface S, and is formed to block other light beams. Light that is transmitted through the aperture portion of the aperture stop 112 is reflected by the prism 114 and is incident on the detection surface S.

The polarizing element 113 is arranged on a position that has a Fourier transform relationship with respect to the optical element 111, and adjusts the polarization direction (polarization state) of light from the optical element 111. The polarizing element 113 can include at least one of, for example, a polarizer that extracts linear polarized light of light from the optical element 111, an optical rotator that rotates the polarization direction, a ¼ waveplate, and a ½ waveplate. The polarizing element 113 is connected to a driving unit 118 (actuator) as shown in FIG. 6, and may be formed to be able to switch (change) the polarization direction to be adjusted.

In this case, the aperture stop 112 and the polarizing element 113 need not be strictly arranged at positions that have a Fourier transform relationship with respect to the optical element 111, and suffice to be arranged at positions that will substantially have a Fourier transform relationship with the optical element. Also, in this embodiment, although the polarizing element 113 is included in the illumination optical system and is arranged between the optical element 111 and the aperture stop 112, the present invention is not limited to this. For example, the polarizing element 113 may be arranged at an arbitrary position on the optical path between the light source LS and the image capturing unit 115 as long as different polarization directions can be generated for the light beams incident from the X-measurement marks on the image capturing unit 115 and the light beams incident from the Y-measurement marks on the image capturing unit 115.

Figure 10:
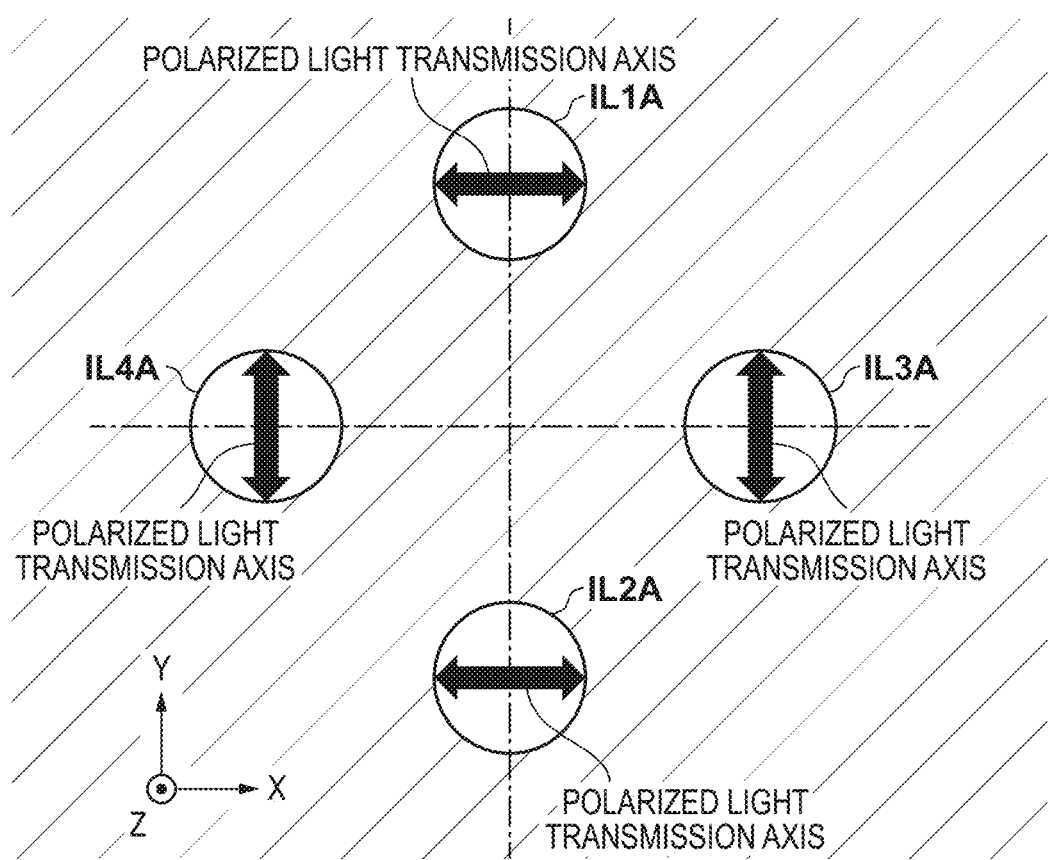
FIG. 10 is a view for explaining polarization control by an aperture stop and a polarizing element according to the first embodiment.

FIG. 10 is a view for explaining polarization control performed by the aperture stop 112 and the polarizing element 113. The aperture stop 112 transmits light, which is to be used for illuminating the marks arranged on the detection surface, through an aperture portions IL1A to IL4A, and blocks other light beams. In this embodiment, since the aperture portions IL1A and IL2A will transmit the first light LA generated by the optical element 111, the illumination light (the first light LA) transmitted through the aperture portions IL1A and IL2A will illuminate the first portion of the detection surface S by the first angle distribution. On the other hand, since the aperture portions IL3A and IL4A will transmit the second light LB generated by the optical element 111, the illumination light (the second light LB) transmitted through the aperture portions IL3A and IL4A will illuminate the second portion of the detection surface S by the second angle distribution.

In addition, the polarizing element 113 is arranged to generate different polarization directions (polarization states) for the first light LA transmitted through the aperture portions IL1A and IL2A of the aperture stop 112 and the second light LB transmitted through the aperture portions IL3A and IL4A of the aperture stop 112. For example, in a case in which the X-measurement marks are arranged on the first portion of the detection surface S illuminated by the first light LA, a polarizer that generates a polarization state (first polarization direction) which has an amplitude in the X direction can be included in a region of the polarizing element 113 through which the first light LA passes. Also, in a case in which the Y-measurement marks are arranged on the second portion of the detection surface S illuminated by the second light LB, a polarizer that generates a polarization state (second polarization direction) which has an amplitude in the Y direction can be included in a region of the polarizing element 113 through which the second light LB passes. This arrangement will reduce a state in which light that has a polarization direction which is not used in the detection of a mark position will be scattered by the mark and the scattered light will be generated as a noise component in the detection signal. Hence, the detection accuracy of the mark positions can be improved.

Figure 11:
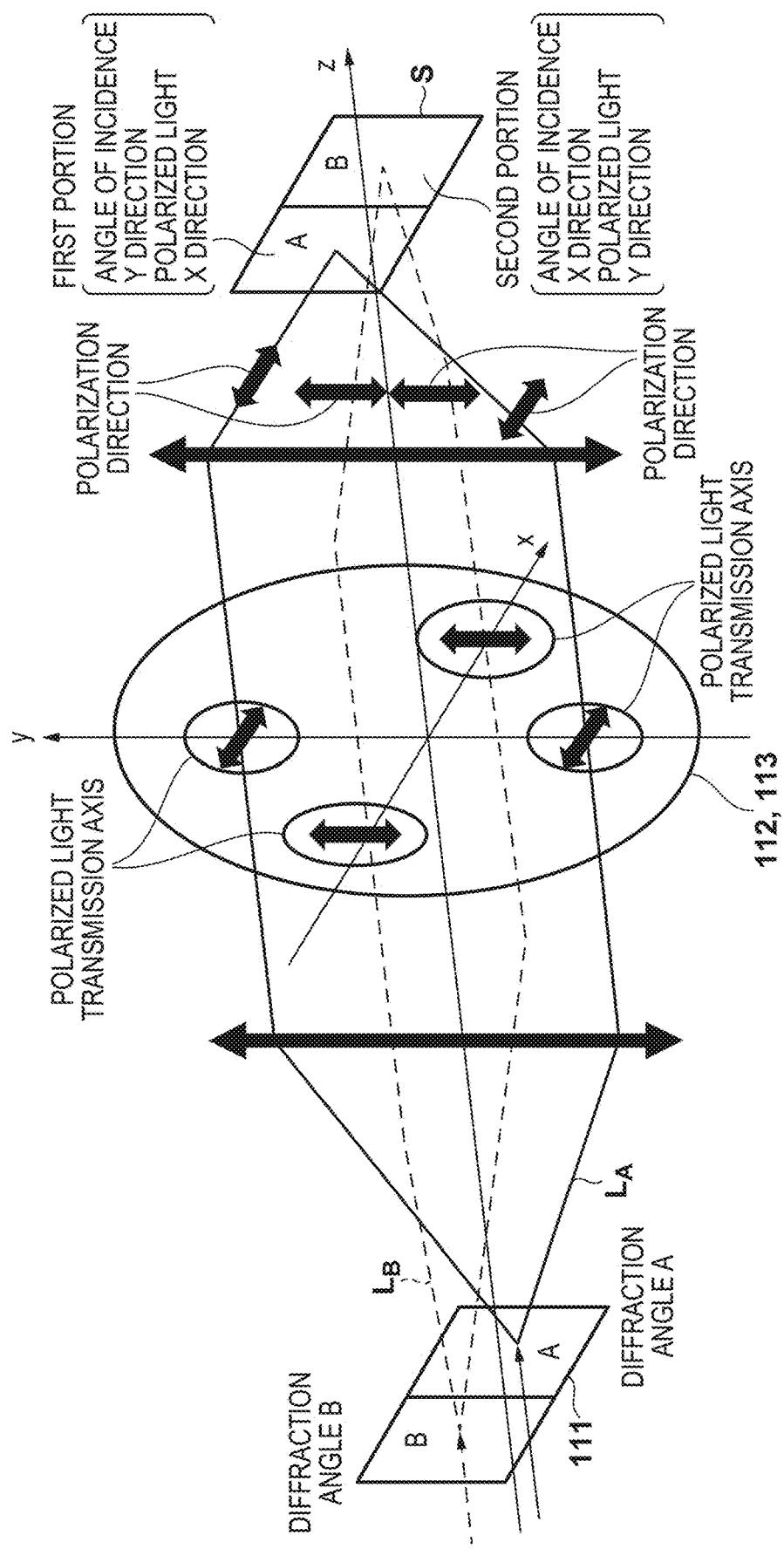
FIG. 11 is a conceptual view showing an example in which an object surface is illuminated by an illumination optical system according to the first embodiment.

FIG. 11 is a conceptual view showing an example in which the detection surface S is illuminated by the illumination optical system including the optical element 111 and the polarizing element 113 described above. An example in which marks that generate a moiré fringe signal are arranged in the detection surface S will be described in this case. Light that passed through the A region of the optical element 111 is polarized in the Y direction and becomes the first light LA which has the first angle distribution. The first light LA is formed by the polarizing element 113 into a polarized state that has an amplitude in the X direction, and illuminates the first portion of the detection surface S on which the X-measurement marks (the mold mark 2a and the substrate mark 3a) are arranged. On the other hand, light that passed through the B region of the optical element 111 is polarized in the X direction and becomes the second light LB which has the first angle distribution. The second light LB is formed by the polarizing element 113 into a polarized state that has an amplitude in the Y direction, and illuminates the second portion of the detection surface S on which the Y-measurement marks (the mold mark 2b and the substrate mark 3b) are arranged.

Figure 12:
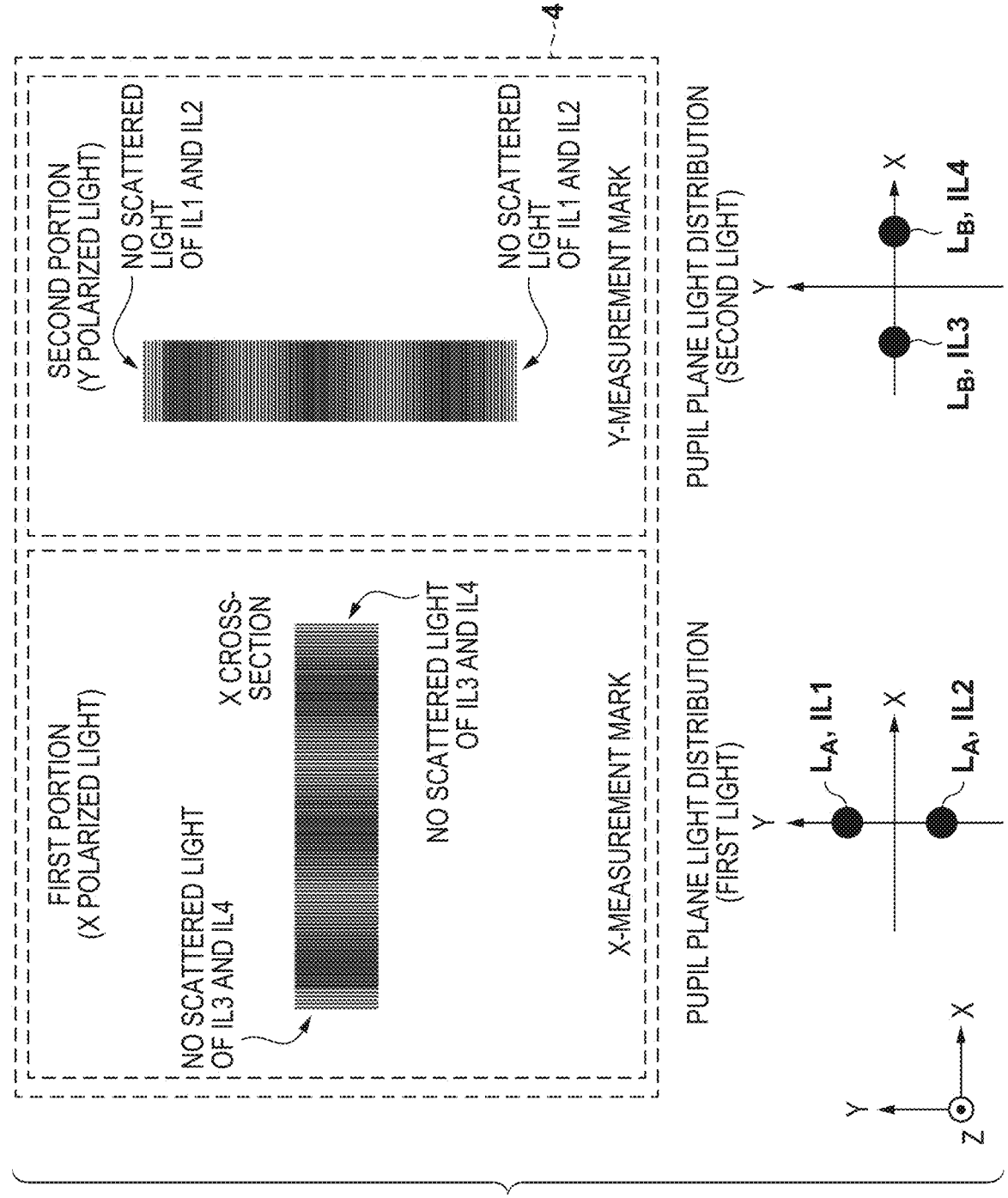
FIG. 12 is a view for explaining mark detection by the alignment scope according to the first embodiment.

As shown in FIG. 12, in the alignment scope 110 according to this embodiment, the first light LA which has an angle distribution in the Y direction and is X-polarized light illuminates the X-measurement marks arranged on the first portion of the detection surface S. That is, since the X-measurement marks are not illuminated by light (for example, the second light LB) which has an angle of distribution in the X direction, a state in which the light will be scattered by the edges of the marks and the scattered light will mix into the detection signal (the moiré fringe signal) as a noise component can be reduced. In addition, as generally known by the Brewster's angle, it is known that the reflectance difference between the X-polarized light and Y-polarized light increases as the reflection angle increases. That is, regarding each X-measurement mark that has a diffraction pattern (that is, a pattern in which a plurality of line elements extending in the Y direction are arranged in the X direction) in the X direction, each X-measurement mark can be detected accurately by increasing the diffraction efficiency by executing illumination by using the X-polarized light and the angle distribution in the Y direction.

A similar arrangement is applicable to the Y-measurement marks arranged in the second portion of the detection surface S. The second light LB which has an angle distribution in the X direction and is Y-polarized light illuminates the Y-measurement marks. That is, since the Y-measurement marks are not illuminated by light (for example, the first light LA) which has an angle of distribution in the Y direction, a state in which the light will be scattered by the edges of the marks and the scattered light will mix into the detection signal (the moiré fringe signal) as a noise component can be reduced. Also, regarding each Y-measurement mark that has a diffraction pattern in the Y direction, each Y-measurement mark can be detected accurately by increasing the diffraction efficiency by executing illumination by using the Y-polarized light and the angle distribution in the x direction.

Figure 13:
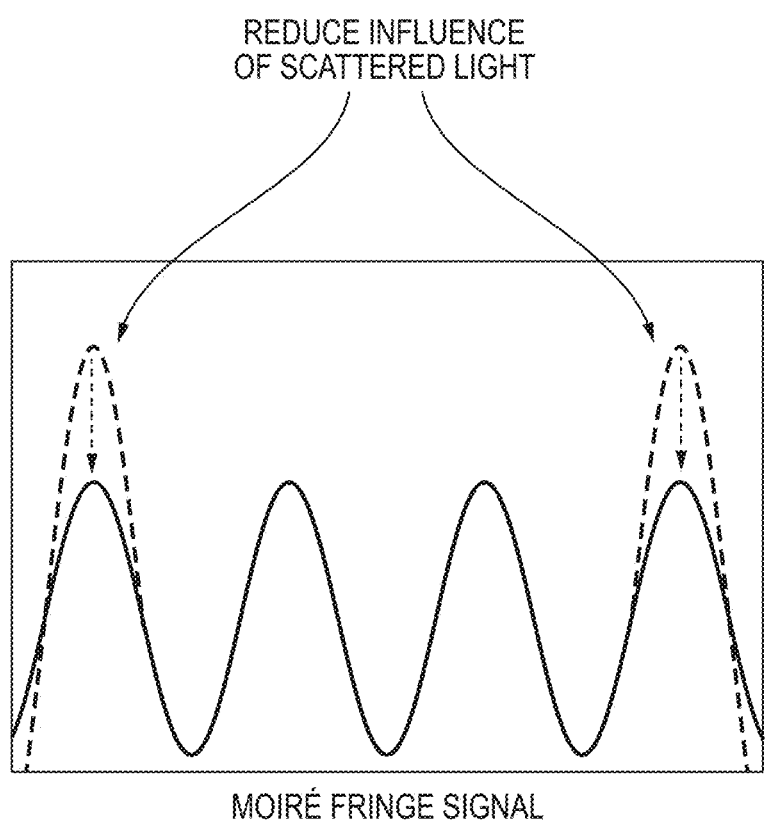
FIG. 13 is a graph showing a signal intensity distribution of a moiré fringe signal detected by the alignment scope according to the first embodiment.

FIG. 13 is a graph showing the signal intensity distribution in the X direction of a moiré fringe signal (for X measurement) detected by the image capturing unit 115 in the alignment scope 110 according to this embodiment. Since the above-described arrangement can reduce the generation of scattered light by the edges of the X-measurement marks and reduce the increase in the intensity of peaks signals at the ends of the signal intensity distribution in the alignment scope 110 according to this embodiment, the detection accuracy of mark positions can be improved.

Also, even in a case in which marks that do not generate a moiré fringe signal are used (marks shown in FIGS. 5A to 5D), the influence of scattered light can be reduced by illuminating the marks in the manner described above. For example, when light having the angle distribution in the Y direction as shown in FIG. 5B is to illuminate the Y-measurement marks, the contrast at the time of mark detection can be improved by changing the light into Y-polarized light. In a similar manner, when light having the angle distribution in the X direction as shown in FIG. 5C is to illuminate the X-measurement marks, the contrast at the time of mark detection can be improved by changing the light into X-polarized light.

As described above, in the alignment scope 110 according to the embodiment, the optical element 111 generates different angle distributions for the light used to illuminate the X-measurement marks and the light used to illuminate the Y-measurement marks, and the polarizing element 113 generates different polarization directions for the light used to illuminate the X-measurement marks and the light used to illuminate the Y-measurement marks. As a result, it becomes possible to prevent the generation of unnecessary light (scattered light) that is not used for mark detection, and the positions of the marks can be measured accurately.

The X-measurement marks and the Y-measurement marks are simultaneously contained in the field of view of the image capturing unit 115 and captured. That is, the image capturing unit 115 simultaneously captures the moiré fringe signal generated by the mold mark 2a and the substrate mark 3a for X measurement and the moiré fringe signal generated by the mold mark 2b and the substrate mark 3b for Y measurement. Since the scattered light (unnecessary light) has been reduced by using the above-described illumination method, the S/N ratio is high in the data (image) of the moiré fringe signals obtained by the image capturing unit 115. Hence, the control unit CNT can specify the peak position based on the data of the moiré fringe signal and obtain the relative positions of the mold M and the substrate W (shot region) in the X direction and the Y direction with high accuracy. In addition, the control unit CNT can relatively drive, based on the obtained relative positions, the mold M and the substrate W by the mold holding unit 30 and the substrate holding unit 50 to accurately position the mold M and the substrate W.

Second Embodiment

Depending on the measurement direction of the position of each mark arranged on a detection surface S, it may be desirable to change the polarization state of light transmitted through each of aperture portions IL1A to IL4A of an aperture stop 112. For example, in a case in which marks that do not generate moiré fringes are to be used as shown in FIGS. 5A to 5D, it may be desirable to generate polarization directions as shown in FIG. 14 for first light LA and second light LB. Hence, an alignment scope 110 may include a plurality of types of polarizing elements 113 as shown in FIGS. 10 and 14, and switch (change) the polarizing element 113 to be arranged on the optical path by a driving unit 118 (a switching unit or a second changing unit) in accordance with the measurement direction of the position of each mark arranged on the detection surface S.

In a similar manner, depending on the size of the mark or the measurement direction of the mark arranged on the detection surface S, it may be desirable to change an angle distribution of light generated by an optical element 111. For example, it may be desirable to use the optical element 111 having an A region, a B region, a C region, and a D region that have different diffraction angles and region sizes from each other in accordance with the size of each mark and the measurement direction of the position of each mark. Hence, the alignment scope 110 may include a plurality of types of optical elements 111 as shown in FIGS. 7 and 15, and switch (change) the optical element 111 to be arranged on the optical path by a driving unit 117 (a switching unit or a first changing unit) in accordance with the size of each mark or the measurement direction of the position of each mark arranged on the detection surface S.

In addition, it is preferable to arrange the optical element 111 at a position conjugate to the detection surface S. Hence, the alignment scope 110 may cause the driving unit 117 to drive the optical element 111 in the optical-axis direction (Z direction) of the illumination optical system to focus (the image forming position of) the illumination light on the detection surface S. Furthermore, the alignment scope 110 may cause the driving unit 117 to drive the optical element 111 in a direction perpendicular to the optical-axis direction of the illumination optical system to execute positioning (in the X and Y directions) of the position (for example, the center position) of each mark on the detection surface S and the illumination region of the optical element 111.

In addition, in a case in which a spatial modulator is to be used as the optical element 111, the angle distribution of the illumination light may be changed in accordance with the time. For example, the illumination of marks (for example, the X-measurement marks) by the first light LA having a first angle distribution and the illumination of marks (for example, the Y-measurement marks) by the second light LB having a second angle distribution can be performed at separate times. In this case, the alignment scope 110 may switch the polarizing element 113 to be arranged on the optical path, among the plurality of types of polarizing element 113, by the driving unit 118 in accordance with the time. In addition, a liquid crystal or a spatial light phase modulator can be used as the optical element 111 to switch between the illumination of marks by the first light LA and the illumination of marks by the second light LB in accordance with the time.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus (imprint method) and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 16A:
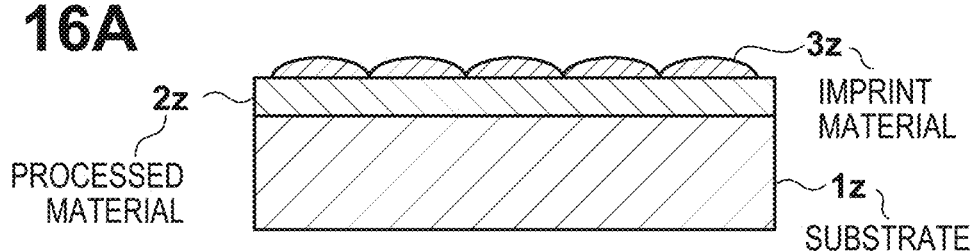
FIGS. 16A to 16F are views showing a method of manufacturing an article.

A detailed method of manufacturing an article will be described next. As shown in FIG. 16A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 16B:
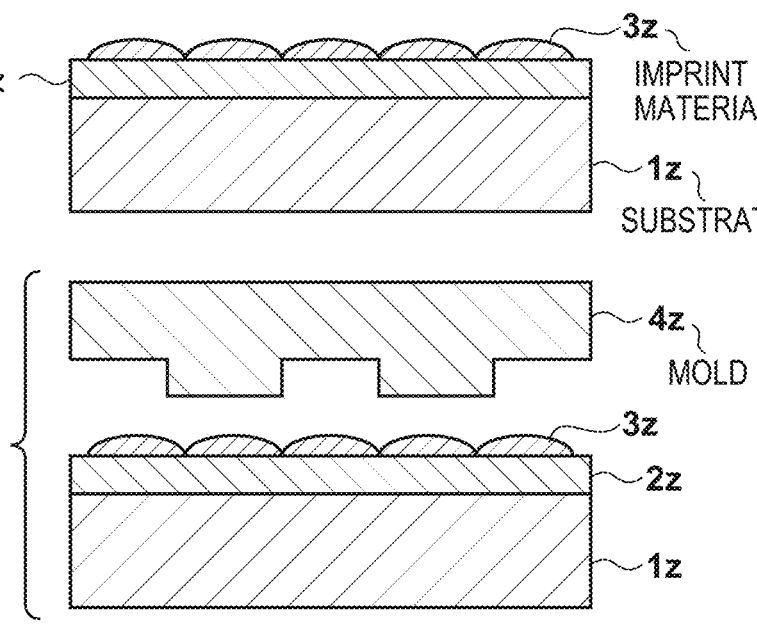
Figure 16C:
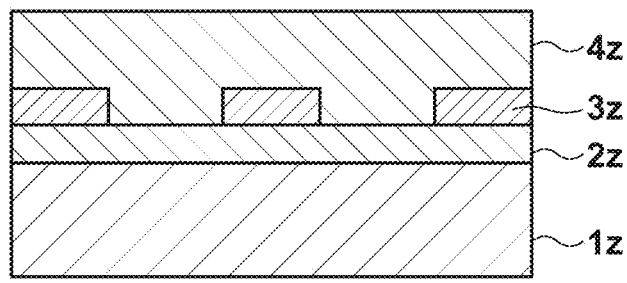

As shown in FIG. 16B, a mold 4z for imprint is caused to face to the substrate 1z such that a pattern with convex and concave portions formed in the mold 4z is directed to the imprint material 3z on the substrate 1z. As shown in FIG. 16C, the mold 4z and the imprint material 3z applied on the substrate 1z are brought into contact with each other, and subjected to a pressure. The gap between the mold 4z and the target material 2z is filled with the imprint material 3z. In this state, by irradiating the imprint material 3z with energy for curing through the mold 4z, the imprint material 3z is cured.

Figure 16D:
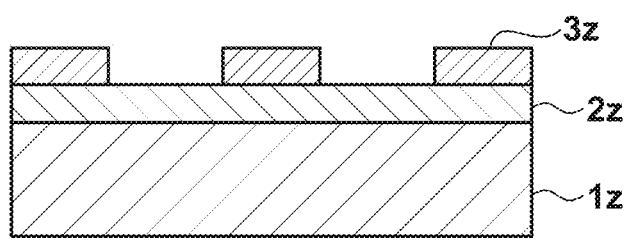

As shown in FIG. 16D, after the imprint material 3z is cured, the mold 4z is separated from the substrate 1z. Then, the pattern of the cured material of the imprint material 3z is formed on the substrate 1z. In the pattern of the cured material, the concave portion of the mold corresponds to the convex portion of the cured material, and the convex portion of the mold corresponds to the concave portion of the cured material. That is, the pattern with convex and concave portions in the mold 4z is transferred to the imprint material 3z.

Figure 16E:
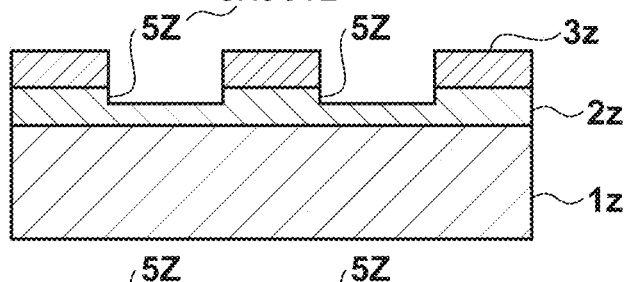
Figure 16F:
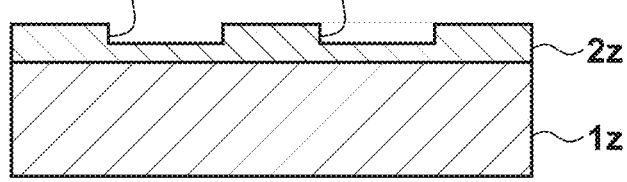

As shown in FIG. 16E, by performing etching process using the pattern of the cured material as an etching resistant mask, a portion of the surface of the target material 2z where the cured material does not exist or remains thin is removed to form a groove 5z. As shown in FIG. 16F, by removing the pattern of the cured material, an article with the grooves 5z formed in the surface of the target material 2z can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-117715 filed on Jun. 25, 2019, which is hereby incorporated by reference herein in its entirety.

What is claimed is:

1. A measurement apparatus that measures a position of an object that includes a first mark and a second mark, the first mark being used for measuring a position of the object in a first direction and the second mark being used for measuring a position of the object in a second direction different from the first direction, the measurement apparatus comprising:
an image capturing unit configured to capture the first mark and the second mark in a state where the first mark and the second mark are contained in a field of view; and
a polarizing element configured to generate:
a plurality of first polarized light beams that illuminate the first mark by being incident on the first mark, the plurality of first polarized light beams being different from each other in incident angles on the first mark, and a polarization direction of each of the plurality of first polarized light beams, in a state of being incident on the first mark, is a first polarization direction parallel to the first direction; and
a plurality of second polarized light beams that illuminate the second mark by being incident on the second mark, the plurality of second polarized light beams being different from each other in incident angles on the second mark, and a polarization direction of each of the plurality of second polarized beams, in a state of being incident on the second mark, is a second polarization direction parallel to the second direction,
wherein the plurality of first polarized light beams obliquely illuminate the first mark, and light from the first mark illuminated with the plurality of first polarized light beams is incident on the image capturing unit, and
wherein the plurality of second polarized light beams obliquely illuminate the second mark, and light from the second mark illuminated with the plurality of second polarized light beams is incident on the image capturing unit.

2. The apparatus according to claim 1, further comprising:
an illumination optical system configured to illuminate the first mark and the second mark,
wherein the polarizing element is included in the illumination optical system.

3. The apparatus according to claim 2, wherein the polarizing element is arranged on a pupil plane of the illumination optical system.

4. The apparatus according to claim 2, further comprising:
an optical element configured to generate, using light from a light source, first light having a first angle distribution and second light having a second angle distribution different from the first angle distribution,
wherein the polarizing element generates the plurality of first polarized light beams from the first light generated by the optical element and the plurality of second polarized light beams from the second light generated by the optical element.

5. The apparatus according to claim 4, wherein the optical element is formed by one member that includes a region for generating the first light and a region for generating the second light.

6. The apparatus according to claim 4, wherein the polarizing element is arranged on an optical path between the optical element and the object.

7. The apparatus according to claim 4, wherein the polarizing element adjusts the polarization state such that the first polarization directions of the plurality of first polarized light beams are formed to the first angle distribution by the optical element, and the second polarization directions of the plurality of second polarized light beams are formed to the second angle distribution by the optical element.

8. The apparatus according to claim 4, wherein the optical element includes at least one of a diffraction optical element, a microlens array, or a spatial light modulator.

9. The apparatus according to claim 4, further comprising:
a plurality of types of optical elements; and
a changing unit configured to change one optical element, among the plurality of types of optical elements, to be arranged on the optical path.

10. The apparatus according to claim 1, further comprising:
a plurality of types of polarizing elements; and
a changing unit configured to change one polarizing element, among the plurality of types of polarizing elements, to be arranged on the optical path.

11. The apparatus according to claim 1, wherein the polarizing element includes at least one of a polarizer, an optical rotator, or a waveplate.

12. A lithography apparatus that forms a pattern on a substrate, the lithography apparatus comprising:
the measurement apparatus defined in claim 1 and configured to measure a position of the substrate as the object; and
a control unit configured to control the position of the substrate based on a measurement result obtained by the measurement apparatus.

13. A method of manufacturing an article, the method comprising:
forming a pattern on a substrate using a lithography apparatus defined in claim 12; and
processing the substrate, on which the pattern has been formed, to manufacture the article.

14. The apparatus according to claim 1, wherein the first polarization direction is a polarization direction having an amplitude in the first direction, and the second polarization direction is a polarization direction having an amplitude in the second direction.

15. The apparatus according to claim 1, further comprising:
an aperture stop that includes a plurality of first aperture portions through which the plurality of first polarized light beams are transmitted, and a plurality of second aperture portions through which the plurality of second polarized light beams are transmitted.

16. The apparatus according to claim 1, further comprising:
an optical element configured to generate:
a plurality of first light beams by diffracting light from a light source; and
a plurality of second light beams by diffracting light from the light source,
wherein the polarizing element generates:
the plurality of first polarized light beams by adjusting, to the first polarization direction, a polarization direction of each of the plurality of first light beams generated by the optical element; and
the plurality of second polarized light beams by adjusting, to the second polarization direction, a polarization direction of each of the plurality of second light beams generated by the optical element.

17. The apparatus according to claim 16, wherein the polarizing element is arranged on a position that has a Fourier transform relationship with respect to the optical element.

18. The apparatus according to claim 1, wherein:
the plurality of first polarized light beams illuminate the first mark by being incident on the first mark along a direction perpendicular to the first direction and parallel to a surface of the substrate, the surface being provided with the first mark and the second mark, and
the plurality of second polarized light beams illuminate the second mark by being incident on the second mark along a direction perpendicular to the second direction and parallel to the surface.

19. The apparatus according to claim 1, wherein the polarizing element is configured to generate:
the plurality of first polarized light beams such that each of the plurality of first polarized light has only the first polarization direction; and
the plurality of second polarized light beams such that each of the plurality of second polarized light has only the second polarization direction.

* * * * *